United States Patent
Gomm et al.

(10) Patent No.: US 7,378,891 B2
(45) Date of Patent: *May 27, 2008

(54) MEASURE-CONTROLLED CIRCUIT WITH FREQUENCY CONTROL

(75) Inventors: Tyler J. Gomm, Meridian, ID (US); Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/606,757

(22) Filed: Nov. 30, 2006

(65) Prior Publication Data

US 2007/0075763 A1    Apr. 5, 2007

Related U.S. Application Data

(63) Continuation of application No. 10/771,611, filed on Feb. 4, 2004, now Pat. No. 7,212,057, which is a continuation of application No. 10/147,657, filed on May 16, 2002, now Pat. No. 6,801,070.

(51) Int. Cl.
*H03H 11/26* (2006.01)
(52) U.S. Cl. .................... 327/263; 327/161
(58) Field of Classification Search ............... None
See application file for complete search history.

(56) References Cited

U.S. PATENT DOCUMENTS

| | | |
|---|---|---|
| 3,955,158 A | 5/1976 | Upadhyayula et al. |
| 3,993,957 A | 11/1976 | Davenport |
| 5,691,660 A | 11/1997 | Busch et al. |
| 5,717,353 A | 2/1998 | Fujimoto |
| 5,930,182 A | 7/1999 | Lee |
| 5,946,244 A | 8/1999 | Manning |
| 6,002,281 A | 12/1999 | Jones et al. |
| 6,081,462 A | 6/2000 | Lee |
| 6,085,345 A | 7/2000 | Taylor |
| 6,088,255 A | 7/2000 | Matsuzaki et al. |
| 6,108,793 A | 8/2000 | Fujii et al. |
| 6,172,537 B1 | 1/2001 | Kanou et al. |
| 6,181,174 B1 | 1/2001 | Fujieda et al. |
| 6,184,753 B1 | 2/2001 | Ishimi et al. |
| 6,219,384 B1 | 4/2001 | Kliza et al. |

(Continued)

OTHER PUBLICATIONS

Jang, Seong-Jin, et al., "A Compact Ring Delay Line for High Speed Synchronous DRAM", *IEEE 1998 Symposium on VLSI Circuits Digest of Technical Papers*, (Jun. 11-13, 1998),60-61.

(Continued)

*Primary Examiner*—Cassandra Cox
(74) *Attorney, Agent, or Firm*—Schwegman, Lundberg & Woessner, P.A.

(57) ABSTRACT

Some embodiments include a delay locked circuit having multiple paths. A first path measures a timing of a first clock signal during a measurement. A second path generates a second clock signal based on the first clock signal. The delay locked circuit periodically performs the measurement to adjust a timing relationship between the first and second clock signals. The time interval between one measurement and the next measurement is unequal to the cycle time of the first clock signal. Additional embodiments are disclosed.

25 Claims, 10 Drawing Sheets

U.S. PATENT DOCUMENTS

| | | | |
|---|---|---|---|
| 6,275,079 | B1 | 8/2001 | Park |
| 6,292,040 | B1 | 9/2001 | Iwamoto et al. |
| 6,313,676 | B1 | 11/2001 | Abe et al. |
| 6,316,976 | B1 | 11/2001 | Miller, Jr. et al. |
| 6,374,360 | B1 | 4/2002 | Keeth et al. |
| 6,378,079 | B1 | 4/2002 | Mullarkey |
| 6,381,194 | B2 | 4/2002 | Li |
| 6,385,129 | B1 | 5/2002 | Silvestri |
| 6,388,480 | B1 | 5/2002 | Stubbs |
| 6,414,903 | B1 | 7/2002 | Keeth et al. |
| 6,421,789 | B1 | 7/2002 | Ooishi |
| 6,421,801 | B1 | 7/2002 | Maddux et al. |
| 6,438,060 | B1 | 8/2002 | Li |
| 6,446,180 | B2 | 9/2002 | Li et al. |
| 6,456,130 | B1 | 9/2002 | Schnell |
| 6,476,653 | B1 | 11/2002 | Matsuzaki |
| 6,492,852 | B2 | 12/2002 | Fiscus |
| 6,600,912 | B1 | 7/2003 | Stepp et al. |
| 6,605,969 | B2 | 8/2003 | Mikhalev et al. |
| 6,621,317 | B2 | 9/2003 | Saeki |
| 6,771,103 | B2 * | 8/2004 | Watanabe et al. ........... 327/161 |
| 6,876,594 | B2 | 4/2005 | Griesmer et al. |
| 6,937,076 | B2 | 8/2005 | Gomm |
| 7,212,057 | B2 | 5/2007 | Gomm et al. |
| 2002/0017939 | A1 | 2/2002 | Okuda et al. |
| 2002/0130691 | A1 | 9/2002 | Silvestri |
| 2003/0011414 | A1 | 1/2003 | Bell |
| 2003/0012320 | A1 | 1/2003 | Bell |
| 2003/0179639 | A1 | 9/2003 | Bell et al. |
| 2003/0214334 | A1 | 11/2003 | Gomm et al. |
| 2003/0214338 | A1 | 11/2003 | Silvestri |
| 2003/0215040 | A1 | 11/2003 | Bell et al. |
| 2005/0242850 | A1 | 11/2005 | Kawasaki |
| 2006/0250859 | A1 | 11/2006 | Bell et al. |

OTHER PUBLICATIONS

Kim, Jae J., et al., "A low-jitter mixed-mode DLL for high-speed DRAM applications", *IEEE Journal of Solid State Circuits*, 35 (10), (Oct. 2000),1430-1436.

Tamura, H., et al., "Partial response detection technique for driver power reduction in high speed memory-to-processor communications", *IEEE International Solid-State Circuits Conference, 1997, Digest of Technical Papers, 44th ISSCC.*, (1997),342-343, 482.

"U.S. Appl. No. 10/147,146 Final Office Action mailed Mar. 7, 2006", 12 pgs.

"U.S. Appl. No. 10/147,146 Non Final Office Action mailed Jan. 10, 2007", 25 pgs.

"U.S. Appl. No. 10/147,146 Non Final Office Action mailed Jun. 29, 2006", 18 pgs.

"U.S. Appl. No. 10/147,146 Non Final Office Action mailed Sep. 20, 2005", 12 pgs.

"U.S. Appl. No. 10/147,146 Notice of Allowance mailed Aug. 24, 2007", NOAR,8 pgs.

"U.S. Appl. No. 10/147,146 Response filed Apr. 10, 2007 to Non Final Office Action mailed Jan. 10, 2007", 21 pgs.

"U.S. Appl. No. 10/147,146 Response filed Jun. 7, 2006 to Final Office Action mailed Mar. 7, 2006", 25 pgs.

"U.S. Appl. No. 10/147,146 Response filed Aug. 8, 2007 to Final Office Action mailed Jul. 10, 2007", 16 pgs.

"U.S. Appl. No. 10/147,146 Response filed Sep. 28, 2006 to Non Final Office Action mailed Jun. 29, 2006", 21 pgs.

"U.S. Appl. No. 10/147,146 Response filed Dec. 12, 2005 to Non Final Office Action mailed Sep. 20, 2005", 23 pgs.

"U.S. Appl. No. 11/458,631 Amendment filed May 15, 2007", 6 pgs.

"U.S. Appl. No. 11/458,631 Non Final Office Action mailed Oct. 3, 2006", 7 pgs.

"U.S. Appl. No. 11/458,631 Response filed Jan. 3, 2007 to Non Final Office Action mailed Oct. 3, 2006", 12 pgs.

* cited by examiner

MEASURE-CONTROLLED CIRCUIT WITH FREQUENCY CONTROL

This application is a Continuation of U.S. Application Ser. No. 10/771,611, filed Feb. 4, 2004, now U.S. Pat. No. 7,212,057, which is Continuation of U.S. Application Ser. No. 10/147,657, filed May 16, 2002, now U.S. Pat. No. 6,801,070, all of which are incorporated herein by reference.

FIELD

The present disclosure relates generally to integrated circuits, including delay locked circuits.

BACKGROUND

Delay locked circuits reside in many integrated circuits for delaying an external signal to obtain an internal signal. The delay locked circuit automatically tracks the external and internal signals to keep them synchronized. The internal signal usually serves as a reference signal for the integrated circuits instead of the external signal because the internal signal matches internal operating conditions of the integrated circuits, such as process, voltage, and temperature, better than the external signal does.

One type of delay locked circuit measures a timing of the external signal in every cycle (period) of the external signal. Based on the measurement, the delay locked circuit adjusts the delay applied to the external signal to keep the external and internal signals synchronized.

In many cases, the operating conditions of the integrated circuit remain unchanged for a time substantially greater than the cycle time of the external signal. Therefore, measuring the external signal to adjust the delay in every cycle time of the external signal wastes power.

DETAILED DESCRIPTION OF THE DRAWINGS

Figure 1:
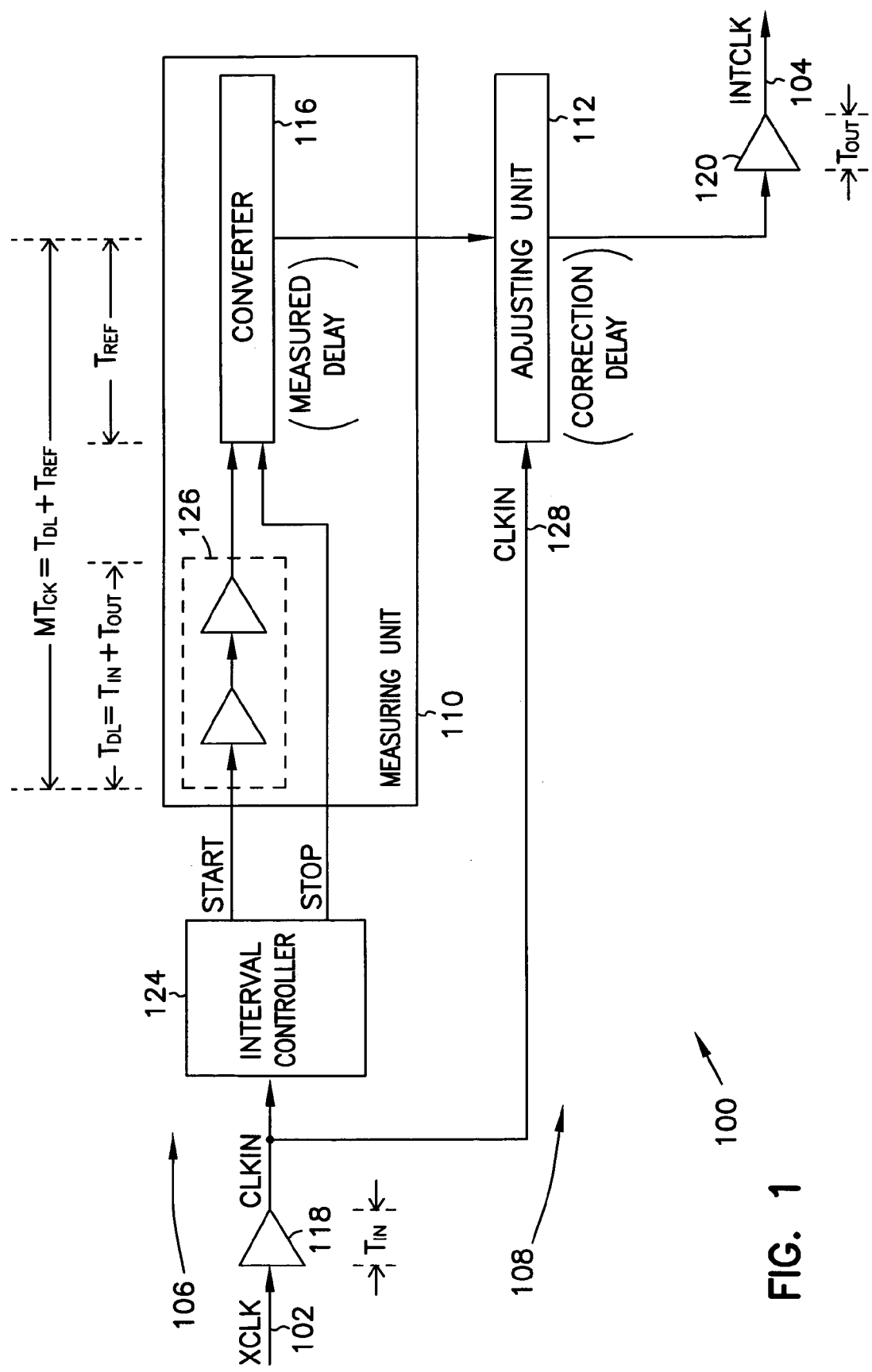
FIG. 1 shows a delay locked circuit according to an embodiment of the invention.

FIG. 1 shows a delay locked circuit according to an embodiment of the invention. Delay locked circuit 100 includes an external node 102 for receiving an external signal XCLK and an internal node 104 for outputting and internal signal INTCLK. The XCLK signal propagates on two paths, a measuring path 106 and an output path 108. Measuring path 106 has a measuring unit 110 for periodically performing a measurement to measure a timing of the XCLK signal. Output path 108 has an adjusting unit 112 for periodically adjusting a delay of output path 108 based on the measurement.

Measuring unit 110 includes a delay model circuit 114 and a converter 116. During each measurement, delay model circuit 114 delays a signal by an amount of time $T_{DL}$. Converter 116 converts a reference time $T_{REF}$ into a measured delay. $T_{REF}$ is a measurement of time, whereas the measured delay is a quantity other than time but depending on $T_{REF}$.

Delay model circuit 114 is modeled after a combination of an input buffer 118 and an output buffer 120 so that a time delay of delay model circuit 114, $T_{DL}$, equals the sum of a time delay of input buffer 118, $T_{IN}$, and a time delay of output buffer 120, $T_{OUT}$, ($T_{DL}=T_{IN}+T_{OUT}$).

The XCLK signal has a cycle time $T_{CK}$. The sum of $T_{DL}$ and $T_{REF}$ equals one or more cycle times of the XCLK signal. $MT_{CK}=T_{DL}+T_{REF}$ or $T_{REF}=MT_{CK}-T_{DL}$, where M is an integer equal to or greater than one.

Adjusting unit 112 includes a correction delay line 122 for applying a correction delay to the output path 108 based on the measured delay. The correction delay and the measured delay have an equal delay quantity.

On output path 108, the XCLK signal propagates from node 102 through input buffer 118, the correction delay line 122, and output buffer 120 to become the INTCLK signal. The INTCLK signal and the XCLK signal are synchronized because the correction delay equals the measured delay. As shown in FIG. 1, $MT_{CK}=T_{DL}+T_{REF}$ where $T_{DL}=T_{IN}+T_{OUT}$, and the correction delay corresponds to $T_{REF}$. Thus, $MT_{CK}=T_{IN}+T_{OUT}+T_{REF}$. On output path 108, $T_{IN}+T_{OUT}+T_{REF}$ is the delay applied to the XCLK signal when it travels from node 102 to node 104 to become the INTCLK signal. Hence, the INTCLK signal is the XCLK signal delayed by $T_{IN}+T_{OUT}+T_{REF}$. Since $MT_{CK}=T_{IN}+T_{OUT}+T_{REF}$, the INTCLK signal is the XCLK signal delayed by $MT_{CK}$.

Delay locked circuit 100 further includes an interval controller 124 connected to measuring unit 110. Interval controller 124 receives an input signal CLKIN and generates a measuring start signal START and a measuring stop signal STOP. The START and STOP signals control a time interval between one measurement and the next measurement and control the duration of each measurement. The START signal starts a measurement and the STOP signal stops the measurement. The START signal is a periodic signal. Interval controller 124 sets the time interval between one measurement and the next measurement to be equal to the cycle time of the START signal. Interval controller 124 sets the duration of each measurement to be one or more cycle times of the XCLK signal and less than the cycle time of the START signal.

Figure 2:
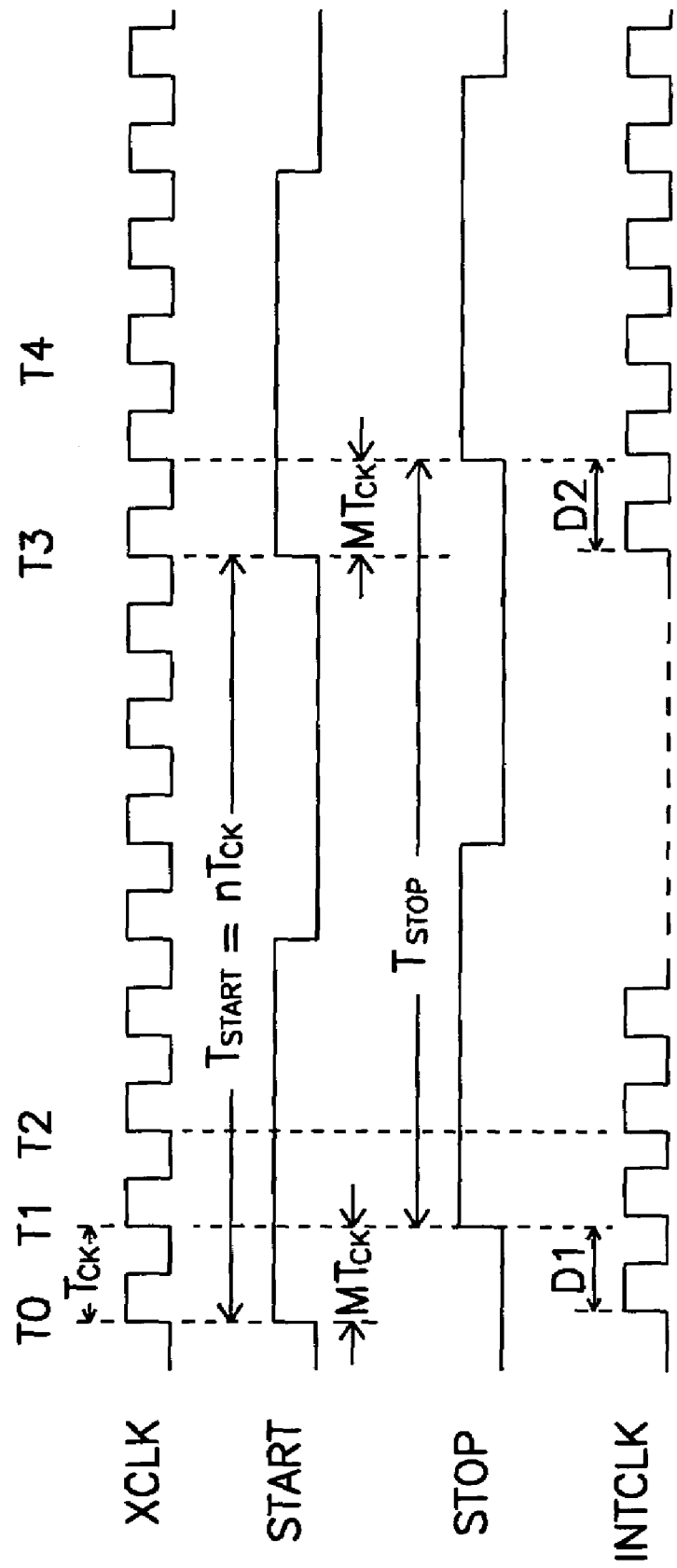
FIG. 2 shows an example of a timing diagram for FIG. 1.

FIG. 2 shows an example of a timing diagram for FIG. 1. D1 and D2 indicate a time delay between the XCLK and INTCLK signals at time T0 and T3, respectively. Interval controller 124 activates the START signal (high) at time T0 to start a measurement and activates the STOP signal at times T1 to stop the measurement. Between these times, measuring unit 110 performs a measurement based on $T_{REF}$ to obtain the measured delay. In FIG. 2, the duration of the measurement is one cycle time of the XCLK signal. Therefore, M equals one and $T_{REF}$ equals one $T_{CK}$ minus $T_{DL}$. Between times T1 and T2, adjusting unit 112 applies a correction delay to output path 108 based on the measured delay. At time T2, the XCLK and INTCLK signals become synchronized. The process repeats between times T3-T4. At time T3, interval controller 124 activates the START signal again to start a new measurement. The XCLK and INTCLK signals may be out of synchronization at time T3. For example, at time T3, the XCLK and INTCLK signals have a delay D2. Adjusting unit 112 applies another correction delay based on the measured delay obtained by the new measurement.

The time interval between one measurement and the next measurement equals the cycle time of the START signal $T_{START}$. $T_{START}=NT_{CK}$, where N is greater than one. Thus, $T_{START}$ is greater than $T_{CK}$. The STOP signal has a cycle time $T_{STOP}$. In FIG. 2, $T_{STOP}$ equals $T_{START}$. In some embodiments, $T_{STOP}$ is unequal to $T_{START}$.

The duration of each measurement equals the time interval between the activations of the START and STOP signals. This time interval equals $MT_{CK}$. In FIG. 2, M equals one. Therefore, the duration of each measurement equals one $T_{CK}$. In some embodiments, M is greater than one and less than N. Thus, the duration of each measurement equals more than one $T_{CK}$.

In FIG. 2, since the time interval between one measurement and the next measurement equals $T_{START}$ where $T_{START}$ is greater than $T_{CK}$, the number of measurements based on $T_{START}$ is less than the number of measurements based on $T_{CK}$. Therefore, using $T_{START}$ instead of $T_{CK}$ between one measurement and the next measurement saves power.

Figure 3:
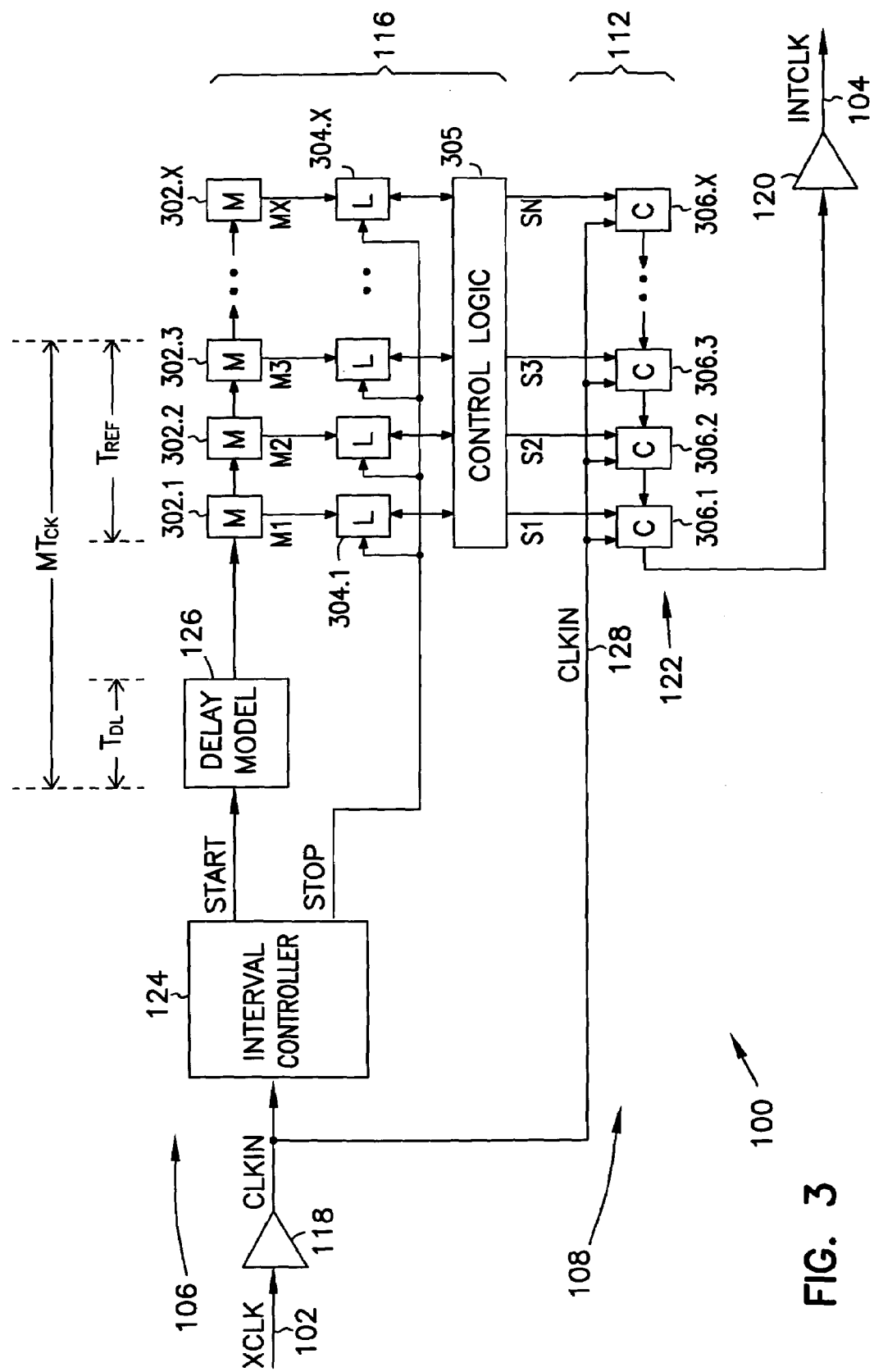
FIG. 3 shows more detail of the delay locked circuit of FIG. 1.

FIG. 3 shows more detail of the delay locked circuit of FIG. 1. Converter 116 has a number of measuring delay elements (M) 302.1-302.X connected to a number of storage elements (L) 304.1-304.X. Measuring delay elements 302.1-302.X have output nodes to output signals M1-MX. A control logic 305 determines the contents of storage elements 304.1-304.X to activate one of the select signals S1-SN. Correction delay line 122 having a number of correction delay elements (C) 306.1-306.X, each being controlled by one of the S1-SN signals. The CLKIN signal enters correction delay line 122 at a variable entry point at any one of the inputs of correction delay elements 306.1-306.X. The CLKIN signal exits the correction delay line 122 at fixed exit point at the output of correction delay elements 306.1. Control logic 305 activates one of the select signals S1-SN to select the entry point.

Storage elements 304.1-304.X can be flip flops, latches, registers, or other devices capable of storing a state (level) of a signal. Each of the measuring delay elements and each of correction delay elements delays a signal for an equal amount of delay.

In a measurement, interval controller 124 activates the START signal at a starting time of the measurement. For example, at starting time T0, the START signal is activated and propagates through delay model circuit 114 for a time equal to $T_{DL}$. At time $T0+T_{DL}$, the START signal enters measuring delay elements 302.1 and propagates through a certain number measuring delay elements for a time equal to $T_{REF}$. For example, the START signal propagates through three measuring delay elements during $T_{REF}$. At time $T0+T_{DL}+T_{REF}$, or after $MT_{CK}$ from T0, the STOP signal is activated to enable storage elements 304.1-304.X to latch the M1-MX signals.

Control logic 305 examines the contents of storage elements 304.1-304.X to determine the last measuring delay elements reached by the START signal when the STOP signal is activated. Based on the contents of storage elements 304.1-304.X, control logic 305 activates one of the S1-SN signals to select the entry point. The CLKIN signal enters the entry point and propagates through a number of correction delay elements equal to the number of measuring delay elements that the START signal propagates through during $T_{REF}$. The CLKIN signal becomes the INTCLK signal at node 104.

In the example where the START signal propagates through three measuring delay elements during $T_{REF}$, control logic 305 activates the S3 signal to select the entry point at correction delay element 306.3. The CLKIN signal propagates from the entry point to node 104 through three correction delay elements 306.1-306.3. Thus, the measured delay equals three measuring delay elements and the correction delay equals three correction delay elements. Since each of the measuring delay elements and each of correction delay elements delays a signal for an equal amount of delay, the correction delay equals the measured delay.

Figure 4:
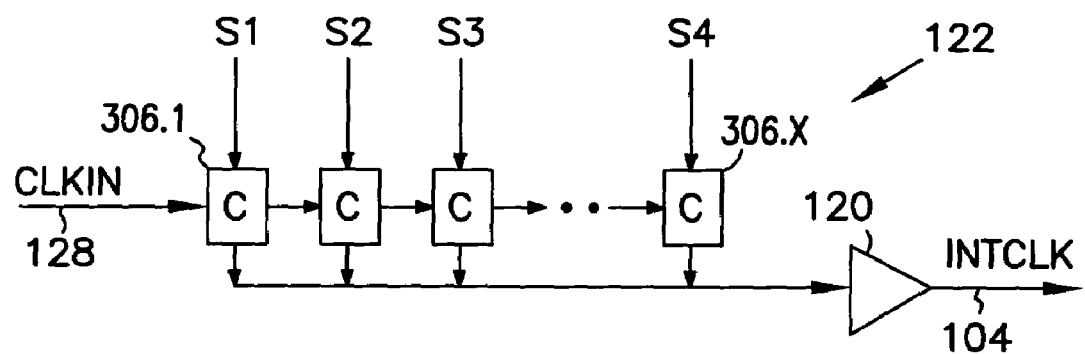
FIG. 4 shows another embodiment of correction delay line of FIG. 3.

FIG. 4 shows another embodiment of correction delay line 122 of FIG. 3. In FIG. 4, the CLKIN signal enters correction delay line 122 at a fixed entry point at correction delay element 306.1. The CLKIN signal exits correction delay line 122 at a variable exit point at any one of the outputs of correction delay elements 306.1-306.X. Control logic activates one of the S1-SN signals to select the exit point. For example, when the S3 signal is activated, the CLKIN signal exits correction delay line 122 at correction delay element 306.3 after propagating through three correction delay elements 306.1-306.3.

Figure 5:
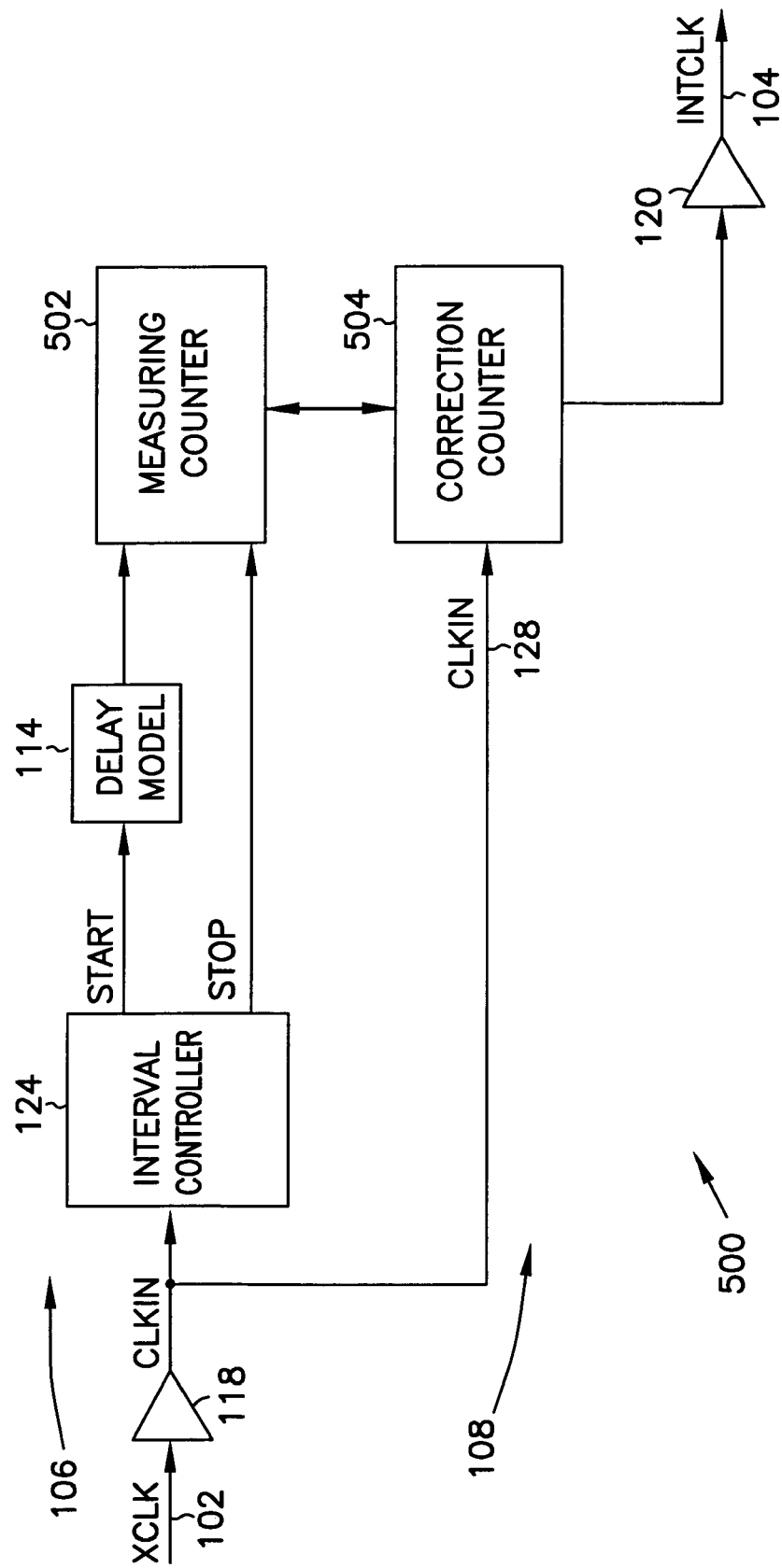
FIG. 5 shows a delay locked circuit having counters according to an embodiment of the invention.

FIG. 5 shows a delay locked circuit having counters according to an embodiment of the invention. Delay locked circuit 500 has measuring path 106 and output path 108. Measuring path 106 has a measuring counter 502. Output path 108 has a correction counter 504. Measuring path 106 obtains a measured delay while counter 502 counts up during $T_{REF}$. Output path 108 applies a correction delay equal to the measured delay while correction counter 504 counts down.

During time $T_{REF}$ of a measurement, measuring counter 502 counts up from zero to a counted number. The START signal starts the count. The STOP signal stops the count. The counted number corresponds to the measured delay. Correction counter 504 loads the counted number and counts down from the counted number to zero. Based on the count down by correction counter 504, output path 108 applies a correction delay to the CLKIN signal equal to the measured delay.

Figure 6:
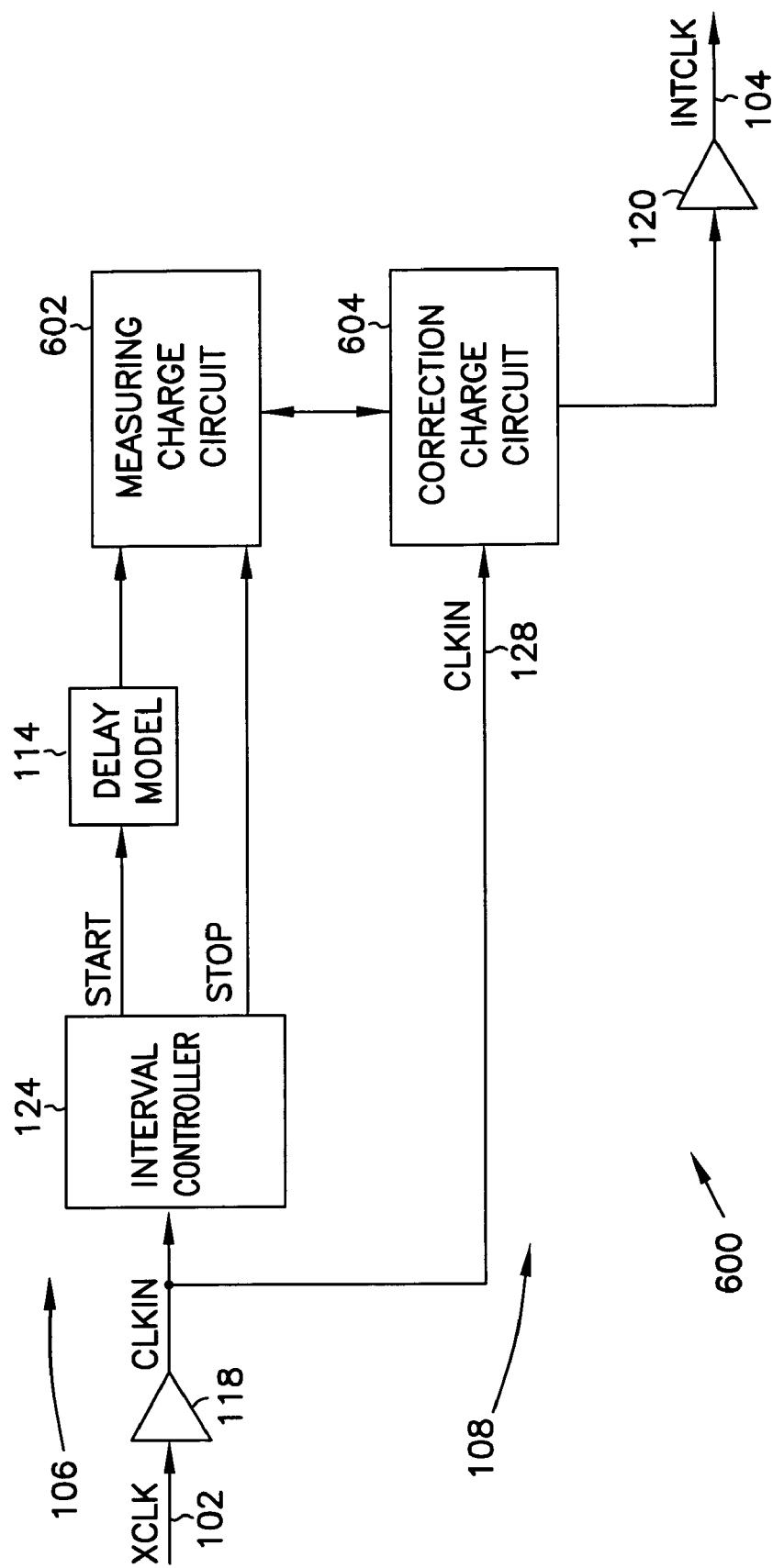
FIG. 6 shows a delay locked circuit having charge circuits according to an embodiment of the invention.

FIG. 6 shows a delay locked circuit having charge circuits according to an embodiment of the invention. Delay locked circuit 600 has measuring path 106 and output path 108. Measuring path 106 has a measuring charge circuit 602. Output path 108 has a correction charge circuit 604. Measuring path 106 obtains a measured delay while measuring charge circuit 602 charges up during $T_{REF}$. Output path 108 applies a correction delay equal to the measured delay while correction charge circuit 604 discharges.

During time $T_{REF}$ of a measurement, measuring charge circuit 602 charges up to a reference charge. The START signal starts the charging process. The STOP signal stops the charging process. The reference charge corresponds to the measured delay. The reference charge is transferred to correction charge circuit 604, which discharges the reference charge. Based on the discharge by correction charge circuit 604, output path 108 applies a correction delay to the CLKIN signal equal to the measured delay.

Figure 7:
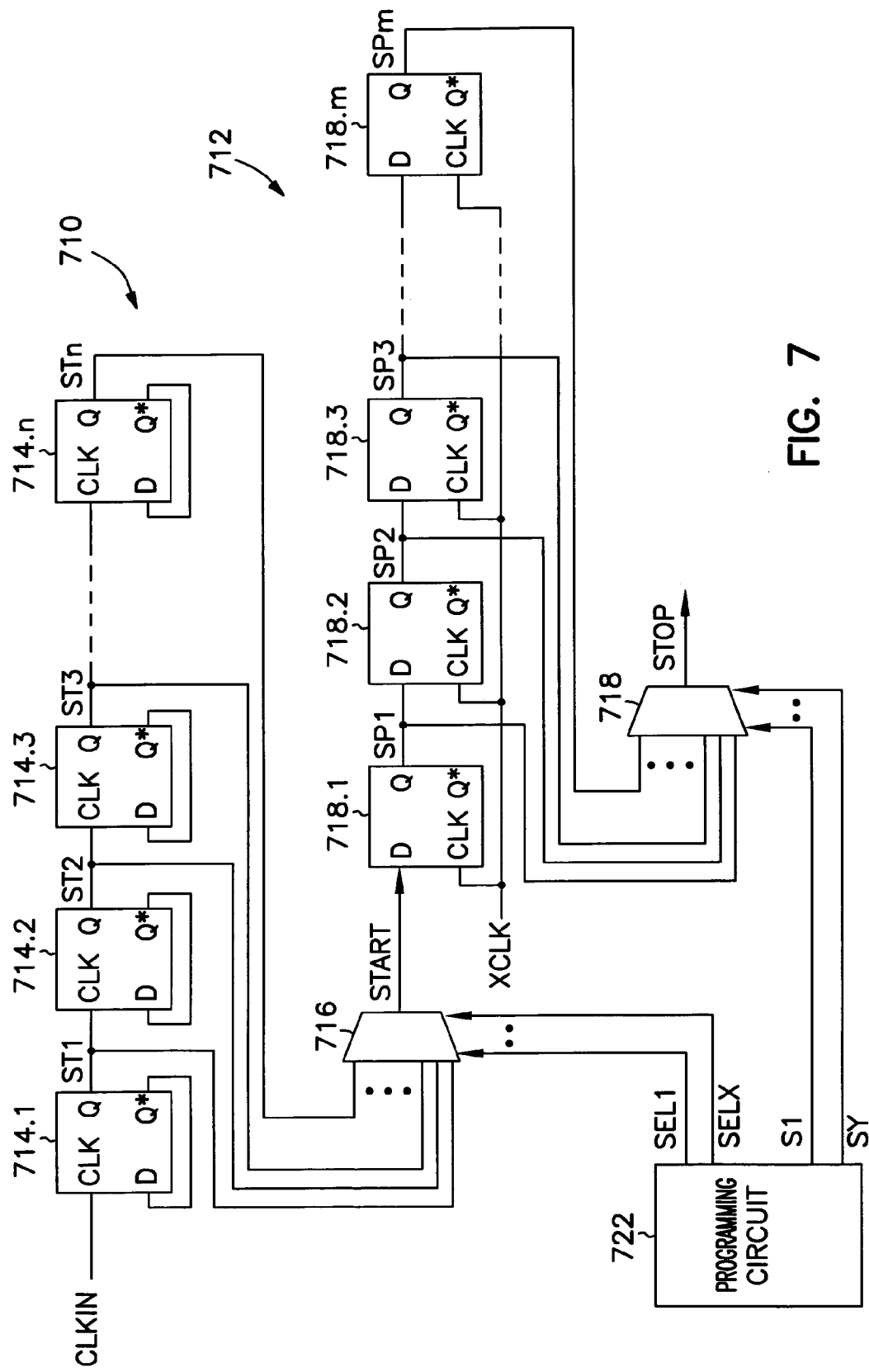
FIG. 7 shows an embodiment of an interval controller of FIG. 1.

FIG. 7 shows an embodiment of interval controller 124 of FIG. 1. Interval controller 124 includes a programmable frequency modifier 710 and a frequency shifter 712. Programmable frequency modifier 710 divides the frequency of the CLKIN signal to generate the START signal. The cycle time of the START signal is greater than the cycle time of the CLKIN signal. Since the CLKIN signal is a delayed version of the XCLK signal, the CLKIN and XCLK signals have an equal cycle time. Therefore, the cycle time of the START signal is also greater than the cycle time of the XCLK signal. Programmable frequency shifter 712 shifts the START signal by one or more cycle time of the XCLK signal.

Programmable frequency modifier 710 includes a plurality of flip flops 714.1-714.n, each having two input nodes CLK and D, and two output nodes Q and Q*. In some embodiments, each of the flip flops 714.1-714.n is a D-Q flip flop. Flip flops 714.1-714.n form a frequency divider that divides the CLKIN signal into a plurality of selectable start signals ST1 through STn. Each succeeding selectable start signal has a cycle time equal to twice the cycle time of the preceding selectable start signal. The STn signal has a cycle time equaled to $2^n$ times the cycle time of the CLKIN signal, where n is the total number of flip flops 714.1-714.n.

A selector 716 selects one of the ST1-STn signals as the START signal based on a combination of select signals SEL1-SELx. In some embodiments, selector 716 is a n:1 multiplexor.

Programmable frequency shifter 712 includes a plurality of flip flops 718.1-718.m, each having two input nodes CLK and D, and two output nodes Q and Q*. In some embodiments, each of the flip flops 718.1-718.m is a D-Q flip flop. Flip flops 718.1-718.m shift the START signal to provide a plurality of selectable stop signals SP1-SPm. Each succeeding selectable stop signal is shifted by one cycle time of the XCLK signal from the preceding selectable stop signal. The STn signal is shifted by m cycle time of the XCLK signal from the SP1 signal, where m is the total number of flip flops 718.1-718.m.

A selector 720 selects one of the SP1-SPm signals as the STOP signal based on a combination of select signals S1-Sy. In some embodiments, selector 716 is a m:1 multiplexor.

A programming circuit 722 connects to selectors 716 and 718. Programming circuit 722 includes fuse devices, electrical fuse devices, laser fuse devices, storage elements, or other programmable elements. These elements are programmed to set a combination of the SEL1-SELx and S1-Sy signals to select the START and STOP signals.

Figure 8:
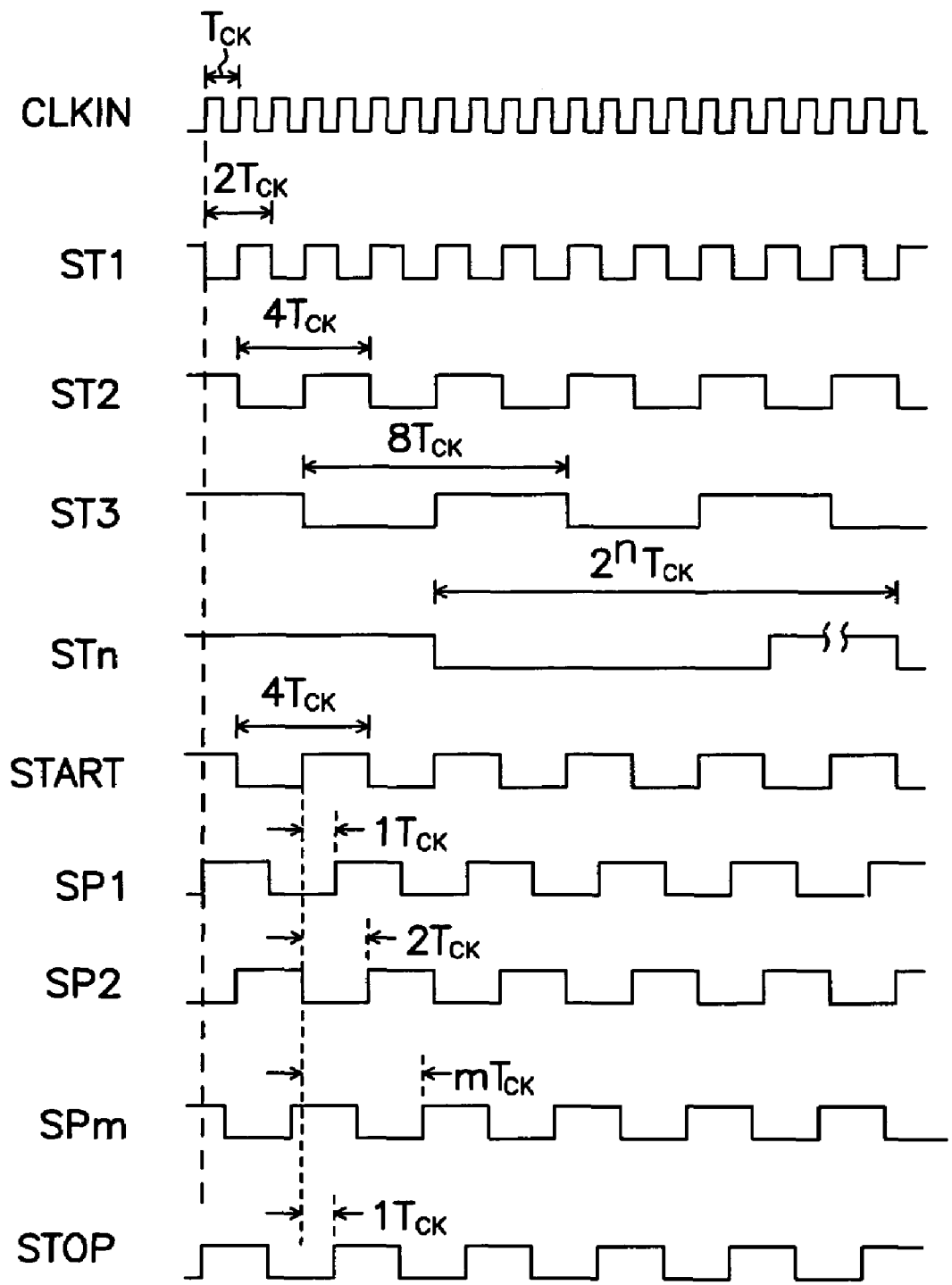
FIG. 8 shows a timing diagram for FIG. 7.

FIG. 8 is a timing diagram for FIG. 7. For clarity, FIG. 8 shows only the ST1, ST2, ST3, and STn signals. The XCLK signal has a cycle time $T_{CK}$. The ST1 signal has a cycle time equaled to $2^1$ times $T_{CK}$ (2 $T_{CK}$). The ST2 signal has a cycle time equaled to $2^2$ times $T_{CK}$ (4 $T_{CK}$) The ST3 signal has a cycle time equaled to $2^3$ times $T_{CK}$ (8 $T_{CK}$). The STn has a cycle time of $2^n$ times $T_{CK}$. In embodiments represented by FIG. 8, the START signal is selected from the ST2 signal as an example. In other embodiments, the START signal can be selected from any one of the ST1-STn signals.

FIG. 8 also shows only the SP1, SP2, and SPm signals for clarity. The SP1, and SP2 signals are shifted from the START signal by one and two $T_{CK}$, respectively. The SPm signals are shifted from the START signal by $mT_{CK}$. In embodiments represented by FIG. 8, the STOP signal is selected from the SP1 signal as an example. In other embodiments, the STOP signal can be selected from any one of the SP1-SPm signals.

Figure 9:
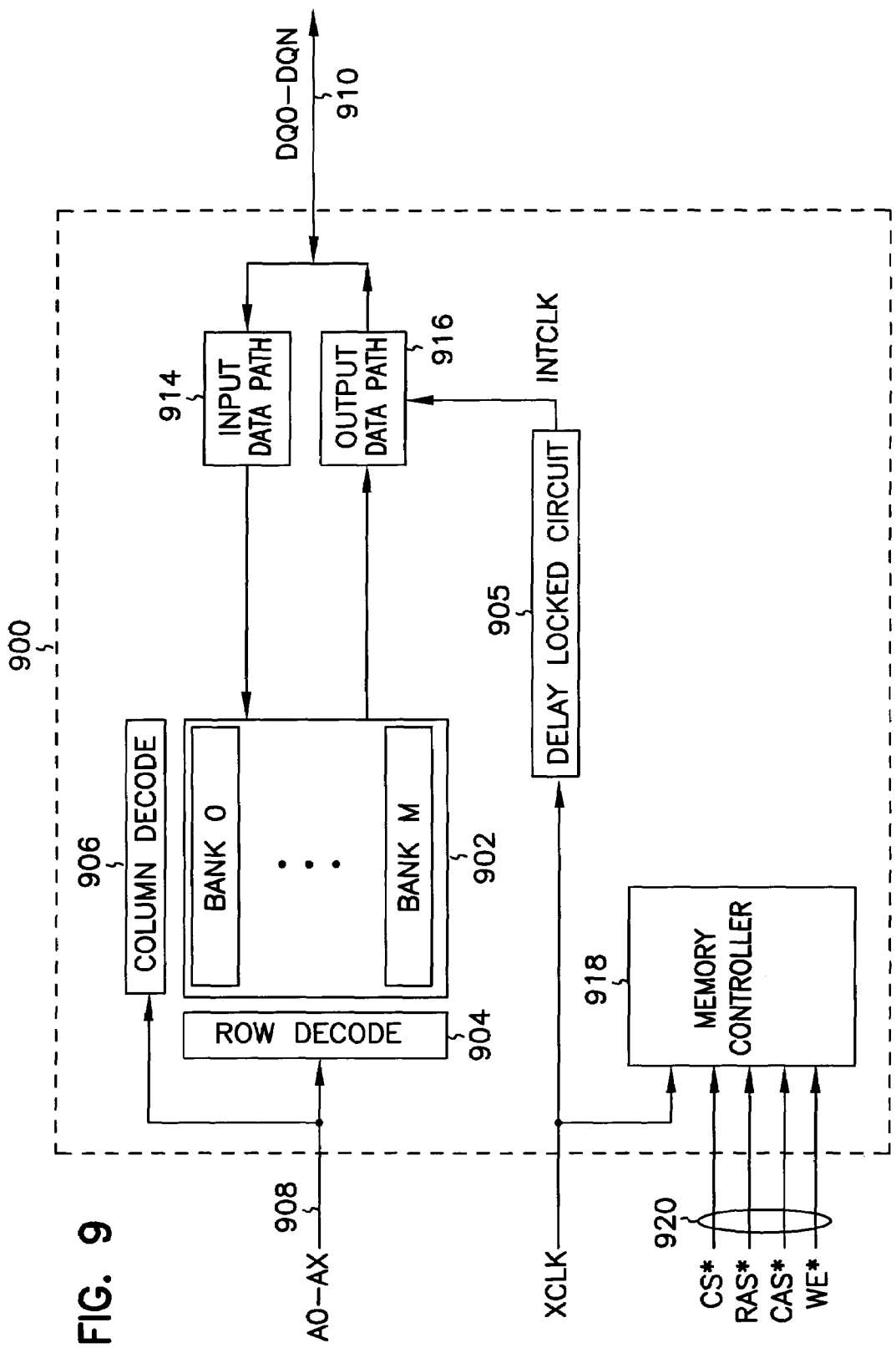
FIG. 9 shows a memory device according to an embodiment of the invention.

FIG. 9 shows memory device according to an embodiment of the invention. Memory device 900 includes a main memory 902 having plurality of memory cells arranged in rows and columns. The memory cells are grouped into a plurality of memory banks indicated by bank 0 through bank M (banks 0-M). Row decode 904 and column decode 906 access the memory cells in response to address signals A0 through AX (A0-AX) on address lines (or address bus) 908. A data input path 914 and a data output path 916 transfer data between banks 0-M and data lines (or data bus) 910. Data lines 910 carry data signals DQ0 through DQN (DQ0-DQN). A memory controller 918 controls the modes of operations of memory device 900 based on control signals on control lines 920. Examples of the control signals include a Chip Select signal CS*, a Row Access Strobe signal RAS*, a Column Access Strobe CAS* signal, a Write Enable signal WE*, and an external signal XCLK.

Memory device 900 further includes a delay locked circuit 905 for delaying the XCLK signal to generate an internal signal INTCLK. The INTCLK signal serves as a clock signal to control a transfer of data on data output path 916. Delay locked circuit 905 periodically performs a measurement. The time interval between one measurement and the next measurement is unequal to the cycle time of the XCLK signal. Delay locked circuit 905 includes embodiments of delay locked circuit 100 (FIG. 1 and FIG. 3).

In some embodiments, memory device 900 is a dynamic random access memory (DRAM) device. In other embodiments, memory device 900 is a static random access memory (SRAM), or flash memory. Examples of DRAM devices include synchronous DRAM commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAMs. Those skilled in the art recognize that memory device 900 includes other elements, which are not shown for clarity.

Figure 10:
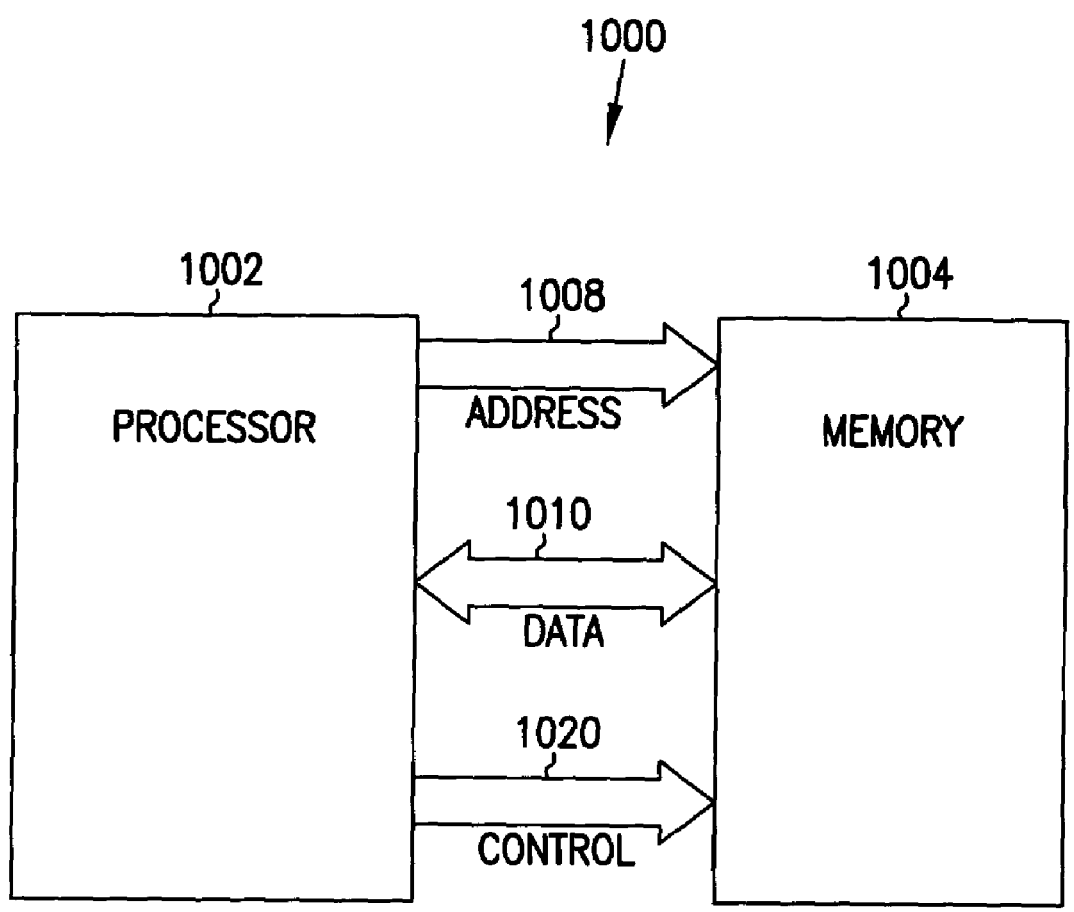
FIG. 10 shows a system according to an embodiment of the invention.

FIG. 10 shows a system 1000 according to an embodiment of the invention. System 1000 includes a first integrated circuit (IC) 1002 and a second IC 1004. IC 1002 and IC 1004 can include processors, controllers, memory devices, application specific integrated circuits, and other types of integrated circuits. In FIG. 10, IC 1002 represents a processor and IC 1002 represents a memory device 1004. Processor 1002 and memory device 1004 communicate using address signals on lines 1008, data signals on lines 1010, and control signals on lines 1020.

Memory device 1004 includes embodiments of memory device 900 (FIG. 9) including delay locked circuit 905, which corresponds to delay locked circuit 100 (FIG. 1 and FIG. 3).

System 1000 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods to operate a delay locked circuit more efficiently. Some embodiments include a delay locked circuit having a measuring unit for obtaining a reference time based on a cycle time of an external signal during a measurement on a first path of the external signal. The delay locked circuit uses the reference time to acquire a measured delay. An adjusting unit adjusts a delay on a second path of the external signal based on the measured delay. The delay locked circuit also includes an interval controller for controlling a time interval between one measurement and the next measurement. Some embodiments include a method of processing signals includes propagating an external signal on a measuring path. A measurement is performed on the measuring path to acquire a measured delay. The method also propagates the external signal on an output path to produce an internal signal. A correction delay based on the measured delay is applied to the output path. The method further performs another measurement at a time interval unequal to the cycle time of the external signal.

The above description and the drawings illustrate some example embodiments of the invention. Other embodiments may incorporate structural, logical, electrical, process, and other changes. In the drawings, like features or like numerals describe substantially similar features. Examples merely show possible variations. Portions and features of some embodiments may be included in, or substituted for, those of others. Many other embodiments will be apparent to those of skill in the art upon reading and understanding the above description. Therefore, the scope of various embodiments of the present disclosure is determined by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
    a measuring unit to acquire a measured delay based a first clock signal during a measurement of the first clock signal on a first path;
    an adjusting unit coupled to the measuring unit to adjust a delay on a second path of the first clock signal based on the measured delay to generate a second clock signal; and
    an interval controller coupled to the measuring unit to cause a time interval between two measurements of the first clock signal to be greater than a cycle time of the first clock signal.

2. The apparatus of claim 1, wherein the measuring unit includes a delay model circuit to delay a signal generated from the first clock signal by at least one cycle time of the first clock signal to provide a reference time, and wherein the measuring unit is to acquire the measured delay from the reference time.

3. The apparatus of claim 2, wherein the adjusting unit includes a correction delay line to apply to the second path a delay based on the measured delay to generate the second clock signal.

4. The apparatus of claim 1, wherein the interval controller includes a programmable frequency modifier to set the time interval between the two measurements.

5. The apparatus of claim 4, wherein the programmable frequency modifier includes a frequency divider to divide a frequency of the first clock signal to provide a plurality of selectable start signals, and wherein the interval controller is to select a selected start signal from the plurality of selectable start signals to start the measurement.

6. The apparatus of claim 5, wherein the interval controller includes a programmable frequency shifter to provide a plurality of selectable stop signals based on the selected start signal, and wherein the interval controller is to select a selected stop signal from the plurality of selectable stop signals to stop the measurement.

7. The apparatus of claim 6, wherein the programmable frequency shifter is to provide the plurality of selectable stop signals with a time interval between an edge of the selected start signal and an edge of each of the selectable stop signals to be less than the time interval between the two measurements.

8. A memory device comprising:
    a plurality of memory cells;
    a data path circuit to transfer data to and from the memory cells;
    a measuring path including a measuring unit to perform a plurality of measurements on a first clock signal, and an interval controller to cause a time interval between two measurements of the plurality of measurements to be greater than a cycle time of the first clock signal; and
    a clock output path including an adjusting unit to adjust a delay of the clock output path based on at least one measurement of the plurality of measurements to generate a second clock signal to control a transfer of data on the data path circuit.

9. The memory device of claim 8, wherein the measuring unit includes a delay model circuit to delay a signal generated from the first clock signal by at least one cycle time of the first clock signal to provide a reference time.

10. The memory device of claim 9, wherein the measuring unit includes a converter to convert a reference time into a measured delay.

11. The memory device of claim 10, wherein the adjusting unit includes a correction delay line to adjust the delay of the clock output path based on the measured delay.

12. The memory device of claim 8, wherein the interval controller includes:
    a plurality of first flip flops to generate a plurality of selectable start signals based on the first clock signal, the plurality of selectable start signals having different frequencies; and
    a first selector to select a selected start signal from the plurality of selectable start signals to start a selected measurement of the plurality measurements.

13. The memory device of claim 12, wherein the interval controller includes:
    a plurality of second flip flops to generate a plurality of selectable stop signals based on the selected start signal; and a second selector to select a selected stop signal from the plurality of the selectable stop signals to stop the selected measurement.

14. The memory device of claim 8, wherein the measuring unit includes a plurality of measuring delay elements to convert the measured delay acquired from one measurement of the plurality of measurements into a delay quantity corresponding to a selected number of measuring delay elements of the plurality of measuring delay elements.

15. The memory device of claim 14, wherein the adjusting unit includes a plurality of correction delay elements to adjust the delay of the clock output path with a selected number of correction delay elements of the plurality of correction delay elements, and wherein the selected number of correction delay elements is equal to the selected number of the measuring delay elements.

16. A system comprising:
a processor; and
a dynamic random access memory device coupled to the processor, the dynamic random access memory device including:
a plurality of memory cells;
a data path circuit to transfer data to and from the memory cells;
a measuring path including a measuring unit to perform a plurality on a first clock signal to obtain a reference time based on at least one cycle time of the first clock signal, and an interval controller to cause a time interval between two measurements of the plurality measurements to be greater than a cycle time of the first clock signal; and
a clock output path including an adjusting unit to adjust a delay of the clock output path based on a measurement among the measurements of the first clock signal on the measuring for generating a second clock signal to control a transfer of data on the data path circuit.

17. The system of claim 16, wherein the measuring unit includes a delay model circuit to delay a signal generated from the first clock signal by at least one cycle time of the first clock signal to provide a reference time, and a converter to convert the reference time into a measured delay, and wherein the adjusting unit includes a correction delay line to adjust the delay of the clock output path based on the measured delay.

18. The system of claim 17, wherein the interval controller includes a frequency divider to divide a frequency of the first clock signal to provide a plurality of selectable start signals, and a first selector to select a selected start signal from a plurality of selectable start signals to start a measurement of the plurality measurements.

19. The system of claim 18, wherein the interval controller includes a programmable frequency shifter to provide a plurality of selectable stop signals based on the selected start signal, and a second selector to select a selected stop signal from a plurality of selectable stop signals to stop the measurement.

20. A method comprising:
producing a measured delay based on a measurement of a first clock signal on a first path;
adjusting a delay of a second path of the first clock signal based on the measured delay to generate a second clock signal; and
causing a time interval between two measurements of the first clock signal to be greater than a cycle time of the first clock signal.

21. The method of claim 20, wherein producing the measured delay includes delaying a signal for at least one cycle time of the first clock signal to generate a reference time, wherein the signal is generated from first clock signal, and converting the reference time into a first delay quantity corresponding to a number of first delay elements.

22. The method of claim 21, wherein adjusting the delay of the second path includes applying to the second path a second delay quantity corresponding to a number of second delay elements, wherein the number of second delay elements is equal to the number of first delay elements.

23. The method of claim 20, wherein causing the time interval between the two measurements to be greater than the cycle time of the first clock signal includes modifying a frequency of the first clock signal to provide a plurality of selectable start signals, and selecting a selected start signal from a plurality of selectable start signals to start the measurement.

24. The method of claim 23, wherein causing the time interval between the two measurements to be greater than the cycle time of the first clock signal includes producing a plurality of selectable stop signals based on the selected start signal, and selecting a selected stop signal from a plurality of selectable stop signals to stop the measurement.

25. The method of 24, wherein a time interval between an edge of the selected start signal and an edge of each of the selectable stop signals is less than the time interval between the two measurements.

* * * * *

UNITED STATES PATENT AND TRADEMARK OFFICE
CERTIFICATE OF CORRECTION

| | | |
|---|---|---|
| PATENT NO. | : 7,378,891 B2 | Page 1 of 1 |
| APPLICATION NO. | : 11/606757 | |
| DATED | : May 27, 2008 | |
| INVENTOR(S) | : Gomm et al. | |

It is certified that error appears in the above-identified patent and that said Letters Patent is hereby corrected as shown below:

In column 9, lines 26-27, in Claim 16, after "first clock" delete "signal to obtain a reference time based on at least one cycle time of the first clock".

In column 10, line 1, in Claim 18, after "from" delete "a" and insert -- the --, therefor.

In column 10, line 7, in Claim 19, after "from" delete "a" and insert -- the --, therefor.

In column 10, line 22, in Claim 21, after "from" insert -- the --.

In column 10, line 35, in Claim 23, after "from" delete "a" and insert -- the --, therefor.

In column 10, line 41, in Claim 24, after "from" delete "a" and insert -- the --, therefor.

Signed and Sealed this
Twenty-seventh Day of September, 2011

David J. Kappos
*Director of the United States Patent and Trademark Office*